INVENTORS
RALPH DAVID KNOTT
ERIC WADHAM
BY
Kinderlein, Kinderlein & Ottinger
ATTORNEYS

INVENTORS
RALPH DAVID KNOTT
ERIK WADHAM
BY
ATTORNEYS

INVENTORS
RALPH DAVID KNOTT
ERIK WADHAM
BY Kinzler, Kinzler & Otto Attys
ATTORNEYS United States Patent Office 3,361,943
Patented Jan. 2, 1968

3,361,943

SEMICONDUCTOR JUNCTION DEVICES WHICH INCLUDE SEMICONDUCTOR WAFERS HAVING BEVELLED EDGES

Ralph David Knott, North Greenford, and Eric Wadham, Bushey Heath, England, assignors to The General Electric Company Limited, London, England Filed July 10, 1962, Ser. No. 208,871
Claims priority, application Great Britain, July 12, 1961, 25,243/61
2 Claims. (Cl. 317—235)

This invention relates to semiconductor devices.

The invention is concerned in particular with semiconductor devices of the kind having a semiconductor wafer which incorporates a first layer of one conductivity type which is contiguous with a second layer of the opposite conductivity type thereby forming a P-N junction, said P-N junction lying in a plane substantially parallel to the main faces of the wafer.

It is known that in semiconductor devices a net electrostatic charge is normally present on the surface of the semiconductor body. In germanium devices, the polarity of this surface charge appears to be dependent on the nature of the surrounding gas, electronegative gases such as ozone and oxygen tending to produce a negative surface charge, and electropositive gases such as water vapour tending to produce a positive surface charge. On the other hand, in silicon devices it has been found that the polarity of the surface charge is normally positive and is less sensitive to the nature of the surrounding gas.

The present invention is based on the realisation that the presence of such a surface charge may have a deleterious effect on the performance of a semiconductor device of the kind specified in respect of the reverse breakdown voltage of said junction of the device. Thus, for example, the surface charge may have the effect of decreasing the reverse breakdown voltage of said junction and/or of causing breakdown of said junction to occur at isolated regions at the surface of the wafer due to irregularities in the surface charge. This last mentioned effect may give rise to instability of the reverse characteristic of said junction and may even give rise to irreversible collapse of the reverse characteristic once breakdown of said junction has occurred due to the high current densities in said regions; it will be appreciated that this effect is of particular significance in silicon controlled rectifiers since, when such a rectifier is fired under two-terminal operation, due, for example, to the occurrence of a transient voltage surge, one of the P-N junctions of the rectifier will be operating in the avalanche portion of its reverse characteristic (that is to say the reverse breakdown voltage of this junction will have been exceeded).

It is accordingly an object of the present invention to provide a semiconductor device of the kind specified wherein the deleterious effect referred to above may be alleviated.

In operation of a semiconductor device of the kind specified with said P-N junction biased in the reverse direction, there is present in the semiconductor wafer a so-called depletion layer extending on either side of said P-N junction, the depletion layer representing that region of the semiconductor contiguous with said junction in which in operation there are no mobile carriers (holes or electrons). Since the portion of the depletion layer on the N-type side of the junction is swept free of electrons, there is present in this portion a residual static positive space charge, and similarly, since the portion of the depletion layer on the P-type side of the junction is swept free of holes there is present in this portion a residual static negative space charge. One factor governing the extension of the depletion layer on either side of the P-N junction is that in this layer there must be a charge balance between the positive static charge on one side of the junction and the negative static charge on the other side of the junction. The space charge density in each portion of the depletion layer is dependent on the net significant impurity concentration in that portion and the lower the value of the net significant impurity concentration in the material on one side of the junction the further will the depletion layer extend into that material for a given applied voltage across the P-N junction.

According to the invention, in a semiconductor device of the kind specified, the net significant impurity concentration in said first layer is greater than in said second layer, there is present on the surface of the wafer a net electrostatic charge which is of the same polarity as the majority charge carriers in said first layer, and the surface of the wafer is bevelled at least in the region where said P-N junction meets the surface in such a manner that the surface of said second layer contiguous with said junction makes an included angle of between 170° and 180° with the plane of said P-N junction.

It has been found that, in a semiconductor device of the kind specified made by a method in accordance with the present invention, the reverse breakdown voltage of said junction is appreciably greated than would have been the case if the lateral surface of the wafer were substantially perpendicular to the plane of said junction.

The invention will be further described with reference to the accompanying drawings, in which.

It is thought that the results achieved by the present invention may be explained as follows with reference to FIGURES 1 and 2 of the accompanying drawings.

Figure 1:
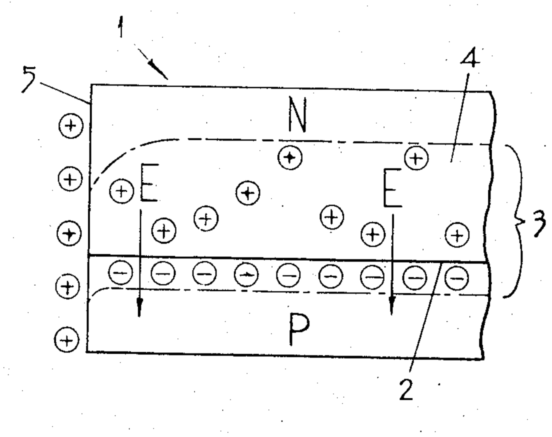
FIGURE 1 is a diagrammatic representation of a portion of a silicon wafer having a single P-N junction which is biased in the reverse direction, the lateral surface of the wafer being perpendicular to the plane of the P-N junction.

Referring to FIGURE 1 of the drawings, in the silicon wafer 1 illustrated therein, breakdown of the P-N junction 2 occurs when the maximum value of the electric field E in the depletion layer 3 reaches a certain critical value, and the breakdown voltage of the P-N junction 2 is therefore dependent on the thickness of the depletion layer 3. Thus, for example, if the depletion layer 3 extends considerably further on the N-type side of the junction 2 than on the P-type side (as is shown in FIGURE 1), the reverse breakdown voltage of the junction 2 is primarily dependent on that portion 4 of the depletion layer 3 on the N-type side of the junction 2, the smaller this minimum thickness the lower being the reverse breakdown voltage. If, also, a positive charge is present on the surface of the wafer 1 (again as is shown in FIGURE 1) then since the lateral surface 5 of the wafer is perpendicular to the plane of the P-N junction 2 the surface charge will augment the positive space charge of the portion 4 of the depletion layer 3 over a region adjacent the lateral surface 5, thereby decreasing the thickness of the portion 4 at the surface 5 and consequently decreasing the reverse breakdown voltage of the junction 2.

Figure 2:
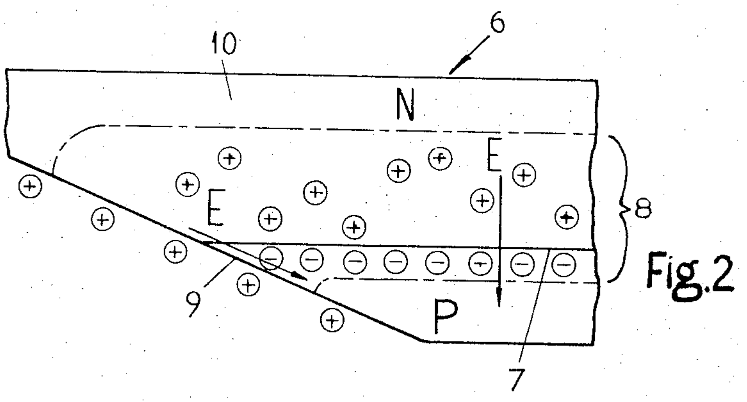
FIGURE 2 is a diagrammatic representation of a portion of a silicon wafer which is similar to that illustrated in FIGURE 1 except that the lateral surface of the wafer is bevelled.

Referring now to FIGURE 2 of the drawings, in the silicon wafer 6 illustrated therein, breakdown of the P-N junction 7 again occurs when the maximum value of the electric field E in the depletion layer 8 reaches a certain critical value. In this case, the lateral surface 9 of the wafer 6 is bevelled in such a manner that the lateral surface of that portion 10 of the depletion layer 8 on the N-type side of the junction 7 makes an included angle of between 170° and 180° with the plane of the junction 7. Thus, since the electric field E in a region of the wafer 6 contiguous with the surface 9 is substantially parallel to the surface 9, the field E in this region is spread over a much greater distance than is the field E in a region remote from the surface 9, and it will be appreciated that this field spreading effect serves to reduce the maximum value of the electric field E in the depletion layer 8 and therefore also serves to bring about an improvement in respect to the reverse breakdown voltage of the junction 7. Further, bevelling of the lateral surface 9 of the wafer 6 in this manner serves to inhibit the occurrence of breakdown of the junction 7 at localised regions at the surface 9. It should be understood that, since the lateral surface 9 is bevelled in such a manner that the lateral surface of the portion 10 makes an obtuse angle with the plane of the junction 7, in the region of that part of the junction 7 contiguous with the lateral surface 9 there will be a greater quantity of positive space charge present on the N-type side of the junction 7 and a smaller quantity of negative space charge present on the P-type side of the junction 7. Thus, one effect of such bevelling of the lateral surface 9 is to cause the part of the boundary of the depletion layer 8 in the region of the lateral surface 9 on the N-type side of the junction 7 to bend even further towards the junction 7 (thereby tending to decrease the reverse breakdown voltage of the junction 7), and, to a lesser extent, to cause that part of the boundary of the depletion layer 8 in the region of the lateral surface 9 on the P-type side of the junction 7 to bend away from the junction 7. However, provided that the above-mentioned obtuse angle is greater than 170°, an improvement in respect of the reverse breakdown voltage of the junction 7 will be obtained despite this last-mentioned effect, since in this case the field spreading effect will be predominant in this respect.

It should be appreciated that similar considerations apply in the case where a negative charge is present on the surface of the wafer of the semiconductor device of the kind specified, the depletion layer extends further on the P-type side of said junction than on the N-type side, and the lateral surface of the wafer is bevelled in such a manner that the lateral surface of that portion of the depletion layer on the P-type side of said junction makes an included angle of between 170° and 180° with the plane of said junction.

One arrangement in accordance with the invention will now be described by way of example with reference to FIGURES 3, 4, and 5 of the accompanying drawings.

In this arrangement, the silicon controlled rectifier includes a silicon body in which are formed four successive layers alternately of P- and N-type conductivity, an anode connected to the end P-type layer, a cathode connected to the end N-type layer, and a gate connected to the intermediate P-type layer.

In the manufacture of the rectifier, a silicon wafer which is to form the silicon body of the completed rectifier is produced by a method which starts with a slice of N-type silicon, about 0.4 millimetre thick, having a resistivity of between 25 and 40 ohm-centimetres, the main faces of the slice being orientated perpendicular to the 111 crystallographic direction. A layer of P-type silicon, 0.07 millimeter thick and contiguous with the whole of the surface of the slice, is produced in the slice by a conventional solid state diffusion technique, in which gallium is used as the acceptor impurity, the concentration of gallium at the exposed face of the P-type layer being of the order of $4 \times 10^{18}$ atoms per cubic centimetre (which is much higher than the donor impurity concentration in the N-type material) and decreasing away from the surface of this layer. The required silicon wafer is then produced by cutting a disc, 14 millimetres in diameter, out of the slice and then bevelling the lateral edge of the disc as will be explained later.

Figure 3:
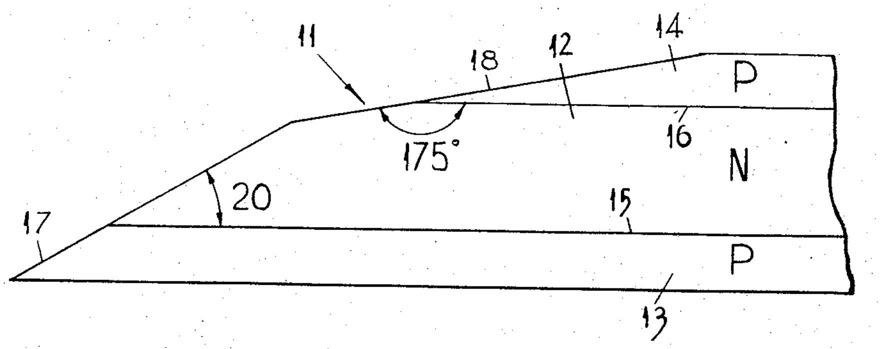
FIGURE 3 is a diagrammatic representation of a portion of a silicon wafer which is to form the silicon body of a silicon controlled rectifier which constitutes one embodiment of the present invention.

Referring now to FIGURE 3 of the drawings, the silicon wafer 11 comprises a central N-type layer 12 and two P-type layers 13 and 14 which respectively extend from the main faces of the wafer 11; the two P-N junctions 15 and 16 are planar and are parallel to the main faces of the wafer 11. It should be understood that the silicon body of the completed rectifier includes a third P-N junction (not shown in the drawings) which is formed in a manner to be described later. The lateral surface of the wafer 11 is formed by two bevelled surfaces 17 and 18; the bevelled surface 17 is such that that part of the surface of the N-type layer 12 contiguous with the junction 15 makes an included angle of 20° with the plane of the junction 15, while the bevelled surface 18 is such that that part of the surface of the N-type layer 12 contiguous with the P-N junction 16 makes an included angle of 175° with the plane of the junction 16.

The bevelled surface 17 is produced by a grinding process in which use is made of a steel block (not shown) in the upper surface of which is formed a part-spherical depression having a radius of curvature of about 2.0 centimetres; an abrasive slurry, consisting of Carborundum powder and water, is deposited over the surface of the depression. The silicon disc which is to form the wafer 11 is placed in the depression with the periphery of one of the main faces of the disc in contact with the surface of the depression, and the disc is then rotated until the whole of the lateral surface of the disc is bevelled, the bevelled surface making an included angle of 20° with the planes of both the P-N junctions 15 and 16. Next, the bevelled surface 18 is produced by a further grinding process in which use is made of a further steel block (not shown) in the upper surface of which is formed a part-spherical depression having a radius of curvature of about 6.9 centimetres; the abrasive slurry referred to above is again deposited over the surface of this depression. The silicon disc is placed in the depression with the periphery of its smaller main face in contact with the surface of the depression, and the disc is then rotated until the desired bevelled surface 18 is produced. As is shown in FIGURE 3, the bevelled surface 18 formed by the second grinding process meets the bevelled surface 17 formed by the first grinding process at the surface of the N-type layer 12.

After the completion of the bevelling processes, the wafer 11 is etched for 25 seconds in a reagent consisting of 132 ccs. nitric acid, 100 ccs. hydrofluoric acid and 50 ccs. glacial acetic acid.

Figure 4:
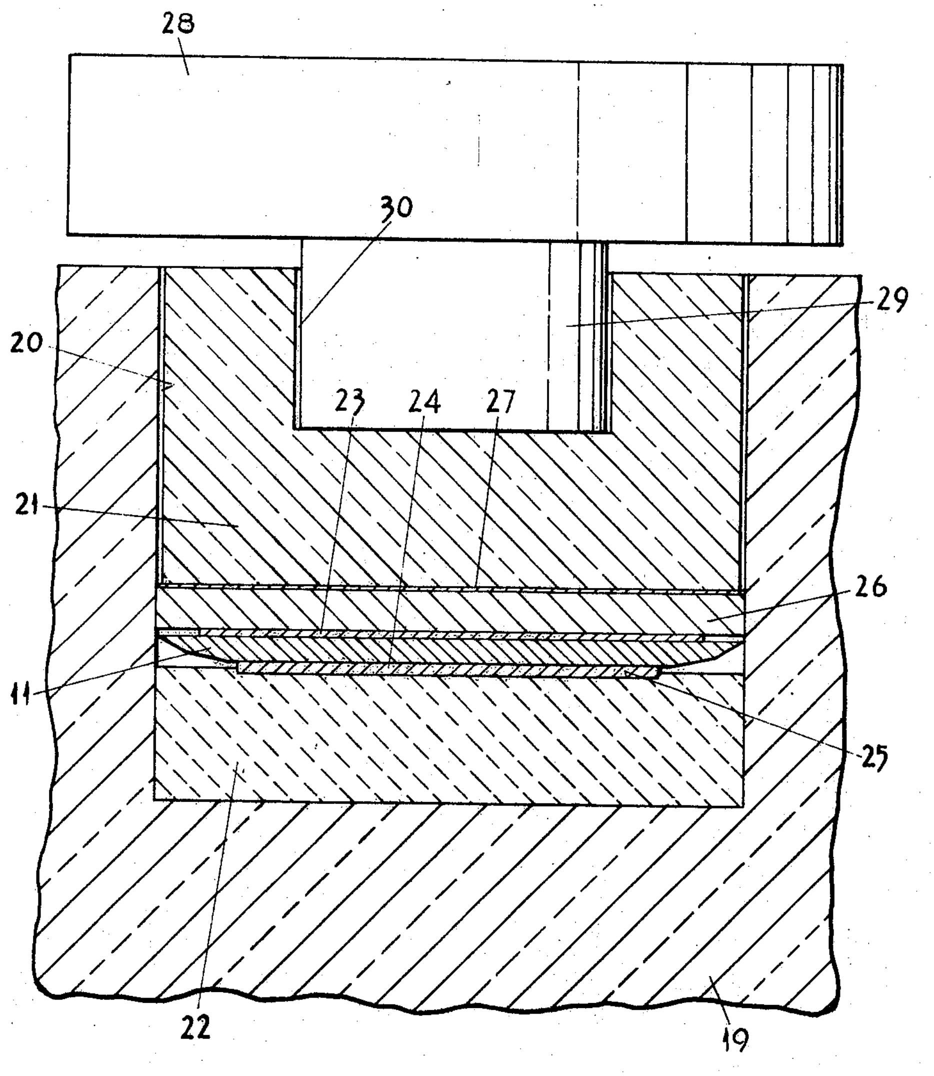
FIGURE 4 is a diagrammatic central sectional elevation of a jig used in the manufacture of the silicon controlled rectifier, component parts of the rectifier being shown mounted in the jig.

Referring now particularly to FIGURE 4 of the drawings, in the next stage in the manufacture of the silicon controlled rectifier, use is made of a graphite jig consisting of a block 19, in the upper surface of which is formed a vertically extending circular cylindrical recess 20, and a plunger 21 which is a sliding fit in the recess 20. A disc 22 of an alumina based ceramic fits inside the recess 20 with one main face in contact with the base of the recess 20. The wafer 11 is cleaned chemically, and is then placed in the recess 20 with the P-type layer 13 in contact with a disc 23 of the eutectic alloy of aluminium and silicon, and with the P-type layer 14 in contact with a disc 24 of gold containing between 0.8% and 1% by weight of antimony; the disc 23 has a diameter of 12.7 millimetres, and a thickness of 0.038 millimetres while the disc 24 has a diameter of 10 millimetres and a thickness of 0.05 millimetre. The disc 24 rests on the upper surface of the ceramic disc 22 and is accurately located with respect to the jig by virtue of part of the disc 24 fitting in a shallow circular recess 25, 0.025 millimeter deep, centrally formed in the upper surface of the disc 22; the disc 24 is provided with a cut-away portion (not seen) formed contiguous with its edge for a reason which will be given later. The upper main face of the disc 23 is held in contact with a tungsten disc 26 which is a sliding fit in the recess 20 and which is 0.75 millimetre thick; the upper main face of the tungsten disc is provided with a coating 27 of a gold-nickel alloy consisting by weight of 82.5% gold and 17.5% nickel for the purpose of facilitating the subsequent soldering of an electrical connection to the disc 26. The wafer 11 and the discs 23, 24 and 26 are positioned so that their centres all lie on the same vertical axis. The graphite plunger 21 rests on the coated face of the tungsten disc 26, and a steel weight 28 in turn rests on the plunger 21, a downwardly projecting portion 29 of the steel weight 28 fitting in a mating recess 30 formed in the upper surface of the plunger 21.

The assembly is subjected to a heat cycle involving hating the assembly in an inert atmosphere to a temperature of 730° C. and then allowing the assembly to cool. During this heat cycle, the aluminium-silicon disc 23 alloys with a portion of the P-type layer 13 of the wafer 11 and the aluminium-silicon alloy thus formed serves to solder the wafer 11 to the tungsten disc 26, thereby forming a low resistance ohmic contact for the P-type layer 13. Also during the heat cycle, the gold-antimony disc 24 alloys with a portion of the P-type layer 14 of the wafer 11, and during the cooling stage of the heat cycle, a layer of N-type silicon is deposited contiguous with the unalloyed part of the P-type layer 14 thereby forming the third P-N junction of the silicon controlled rectifier.

The composite structure incorporating the wafer 11 is removed from the jig and is then subjected to a chemical cleaning process, washed and dried.

Figure 5:
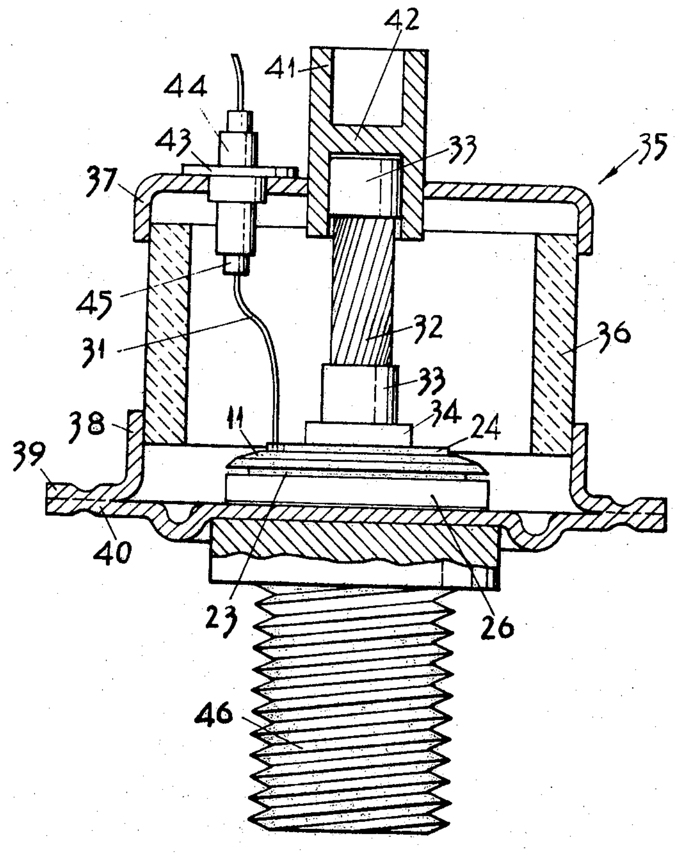
FIGURE 5 is a central sectional elevation of the completed rectifier.

Referring now particularly to FIGURE 5 of the drawings, an aluminium wire 31, 0.38 millimetre in diameter, is secured to the P-type layer 14 by means of an ultrasonic welding technique, the wire 31 thereby forming a low resistance ohmic contact for the layer 14; that end of the wire 31 secured to the layer 14 is positioned in the cut-away portion of the disc 24. An electrical connection for the newly formed N-type layer of the wafer 11 is provided in the form of a flexible copper lead 32 the ends of which are respectively provided with two copper ferrules 33, one of the ferrules 33 being soldered to a molybdeum disc 34 which is in turn soldered to the disc 24.

The whole of the structure incorporating the wafer 11 is then mounted in a hermetically sealed envelope 35 filled with dry nitrogen, the envelope 35 including a ceramic tube 36 the ends of which are respectively sealed to a steel end cap 37 and a circular cylindrical copper member 38; that end of the cylindrical member 38 remote from the tube 36 is provided with an outwardly projecting circumferential flange 39 which is cold welded to the periphery of a copper disc 40. A copper tube 41 having a central partition 42 is sealed through the steel end cap 37, and that ferrule 33 of the copper lead 32 remote from the wafer 11 is secured tightly inside one end of the tube 41. A metal eyelet 43 is also sealed through the base of the end cap 37, and a small ceramic tube 44 is sealed through the eyelet 43. The aluminium wire 31 passes through the ceramic tube 44, that part of the wire 31 passing through the tube 44 being sealed inside a steel sleeve 45 which is in turn sealed inside the tube 44. The coating 27 of the tungsten disc 26 is soldered to the inner main face of the copper disc 20, and a copper stud 46 is soldered to the outer main face of the disc 40.

It should be understood that in the silicon controlled rectifier described above, the copper stud 46 provides an electrical connection to the anode of the rectifier, the tube 41 and the copper lead 32 provide an electrical connection to the cathode of the rectifier, and the wire 31 provides an electrical connection to the gate of the rectifier.

In the rectifier manufactured as described above, a positive electrostatic charge is automatically present on the surface of the silicon wafer 11.

It is found that the forward breakdown voltage of the rectifier described above in the absence of a firing current applied to the gate of the rectifier is considerably greater than that for a similar rectifier in which at least that part of the lateral surface of the wafer in the region of that junction corresponding to the junction 16 is perpendicular to the main faces of the rectifier, the forward breakdown voltage in the former case being about 900 volts and the forward breakdown voltage in the latter case being about 500 volts.

It should be understood that, in the rectifier described above, the bevelled surface 17 serves to bring about an improvement in respect of the overall reverse breakdown voltage of the rectifier and that such improvement is achieved provided that the included angle which the surface of the P-type layer 12 contiguous with the junction 15 makes with the junction 15 lies in the range 15° to 60°; bevelling of the lateral surface of a silicon wafer in a manner exemplified by the bevelled surface 17 forms the subject of United States patent application Ser. No. 207,968 filed July 6, 1962 by William T. Clark, Ralph D. Knott and Eric Wadham and owned by the assignee of the present application.

In an alternative arrangement to that described above, the required bevelling of the lateral surface of the semiconductor wafer of a semiconductor device in accordance with the present invention could be produced by etching instead of by lapping. Thus, for example, the silicon wafer of a silicon P-N junction rectifier in accordance with the present invention could be produced as follows. The manufacture of this silicon wafer starts with a slice of silicon which is of N-type conductivity except for a layer of P-type conductivity formed contiguous with the whole of the surface of the slice, this slice being exactly similar to the previously described slice out of which was cut the disc from which the wafer 11 was formed. That part of the P-type layer at one main face of the slice is removed by lapping so as to leave a single planar P-N junction at the interface between the P-type layer and the remainder of the silicon slice, and a disc which is to form the silicon wafer is then cut out of the slice.

A circular layer of wax is deposited centrally on the P-type main face of the disc so as to leave exposed an annular portion of the P-type main face of the disc contiguous with the periphery of the disc. The required silicon wafer is then produced by immersing the disc for between five and nine minutes in a reagent consisting of 132 ccs. nitric acid, 100 ccs. hydrofluoric acid, 80 ccs. glacial acetic acid and 80 ccs. orthophosphoric acid; this reagent is a so-called "slow" etch and attacks the low resistivity P-type layer preferentially with respect to the high resistivity N-type layer. Thus a portion of the exposed P-type layer is etched away, thereby forming a circumferential shoulder where the plane in which the P-N junction lies intersects the surface of the disc; since a "slow" etch is used for this etching process the P-type layer is not etched through to the N-type layer other than in a region contiguous with the shoulder. The shape of the shoulder is such that at the shoulder the newly formed surface of the P-type layer subtends an angle of about 5° with the plane of the P-N junction.

After the completion of this etching process, low resistance ohmic contacts for the N- and P-type layers of the disc are formed in conventional manner. Finally, the structure incorporating the silicon wafer is encapsulated in conventional manner in a hermetically sealed envelope.

In further alternative arrangements in accordance with the invention, germanium could be used as the semiconductor instead of silicon. With germanium devices manufactured by a method in accordance with the invention, either a positive or a negative electrostatic charge can be produced on the surface of the germanium wafer, for example by encapsulating the wafer in a hermetically sealed envelope filled with an appropriate gas.

We claim:

1. A semiconductor device including a semiconductor wafer which incorporates a first layer of one conductivity type which is contiguous with a second layer of the opposite conductivity type thereby forming a first P-N junction, said second layer being also contiguous with a third layer of said one conductivity type thereby forming a second P-N junction, said P-N junctions substantially coinciding with different cross-sections of the wafer in planes parallel to the main faces of the wafer, the net significant impurity concentration in said second layer being less than in each of said first and third layers, there being present on the surface of the wafer a net electrostatic charge which is of the same polarity as the majority charge carriers in said first and third layers, and the lateral surface of the wafer being bevelled in such a manner that all round the periphery of the wafer the surface of said second layer contiguous with said first junction makes an included angle of between 170° and 180° with the plane of said first junction, and the surface of said second layer contiguous with said second junction makes an included angle of between 15° and 60° with the plane of said second junction.

2. A silicon controlled rectifier including a silicon wafer in which are formed four successive layers alternately of P- and N-type conductivity, an anode connected to the end P-type layer, a cathode connected to the end N-type layer, and a gate connected to the intermediate P-type layer, the P-N junctions between the intermediate N-type layer and the two P-type layers substantially coinciding with different cross-sections of the wafer in planes parallel to the main faces of the wafer, the net significant impurity concentration in the intermediate N-type layer being less than in each of the P-type layers, and the lateral surface of the wafer being bevelled in such a manner that all round the periphery of the wafer the surface of the intermediate N-type layer contiguous with the end P-type layer makes an included angle of between 15° and 60° with the plane of the relevant junction, and the surface of the intermediate N-type layer contiguous with the intermediate P-type layer makes an included angle of between 170° and 180° with the plane of the relevant junction.

References Cited

UNITED STATES PATENTS

| | | | |
|---|---|---|---|
| 2,878,152 | 3/1959 | Runyan et al. | 148—33 |
| 2,989,650 | 6/1961 | Doucette et al. | 307—88.5 |
| 3,196,058 | 7/1965 | Webster | 148—186 |
| 2,672,528 | 3/1954 | Shockley | 317—235 |
| 2,840,885 | 7/1958 | Cressell | 29—25.3 |
| 2,846,340 | 8/1958 | Jenny | 317—235 |
| 2,879,190 | 3/1959 | Logan et al. | 317—235 |
| 2,927,011 | 3/1960 | Stead. | |
| 2,929,859 | 3/1960 | Loferski | 317—235 |
| 2,962,605 | 11/1960 | Grosvalet | 317—235 |
| 2,980,830 | 4/1961 | Shockley | 317—235 |
| 3,007,090 | 10/1961 | Rutz | 317—235 |
| 3,208,924 | 9/1965 | Mueller | 204—143 |
| 3,226,268 | 12/1965 | Bernard | 148—33.2 |
| 3,255,055 | 6/1966 | Ross | 148—186 |

FOREIGN PATENTS

| | | |
|---|---|---|
| 1,228,285 | 8/1960 | France. |
| 1,197,172 | 11/1959 | France. |
| 1,273,633 | 9/1961 | France. |
| 883,468 | 11/1961 | Great Britain. |

JOHN W. HUCKERT, *Primary Examiner.*

JAMES D. KALLAM, *Examiner.*

A. S. KATZ, A. M. LESNIAK, *Assistant Examiners.*